United States Patent
Wen et al.

(10) Patent No.: US 10,712,888 B2
(45) Date of Patent: Jul. 14, 2020

(54) CAPACITANCE DETECTION CIRCUIT AND ELECTRONIC DEVICE

(71) Applicant: SHENZHEN GOODIX TECHNOLOGY CO., LTD., Guangdong (CN)

(72) Inventors: Ya-Nan Wen, Taipei (TW); Yingsi Liang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 6 days.

(21) Appl. No.: 16/179,271

(22) Filed: Nov. 2, 2018

(65) Prior Publication Data

US 2019/0073060 A1  Mar. 7, 2019

Related U.S. Application Data (63) Continuation of application No. PCT/CN2017/076134, filed on Mar. 9, 2017.

(51) Int. Cl.
    G06F 3/041 (2006.01)
    G06F 3/044 (2006.01)
    H03K 17/96 (2006.01)

(52) U.S. Cl.
    CPC ......... *G06F 3/044* (2013.01); *G06F 3/0416* (2013.01); *G06F 3/0418* (2013.01);
    (Continued)

(58) Field of Classification Search
    CPC ......... G06F 3/041; G06F 3/045; G06F 3/038; G01R 27/26; G09G 5/00; G06K 11/06; G08C 21/00
    See application file for complete search history.

(56) References Cited

U.S. PATENT DOCUMENTS 9,019,220 B1   4/2015 Klein et al.
2008/0179112 A1*  7/2008 Qin .................. G06F 3/038
                                                178/18.06

(Continued)

FOREIGN PATENT DOCUMENTS

CN   1941037 A    4/2007
CN   104375725 A  2/2015

(Continued)

OTHER PUBLICATIONS

English Abstract Translation of CN104375725A.

(Continued)

*Primary Examiner* — Pegeman Karimi
(74) *Attorney, Agent, or Firm* — WPAT, P.C., Intellectual Property Attorneys; Anthony King (57) ABSTRACT

The present disclosure provides a capacitance detection circuit, which includes a sense circuit coupled to a plurality of receive electrodes and configured to generate a plurality of sense results, the plurality of sense results being associated with capacitance between a plurality of transmit electrodes and the plurality of receive electrodes; and a first driving circuit coupled to the plurality of transmit electrodes; wherein when the first driving circuit keeps at least one first transmit electrode of the plurality of transmit electrodes floating, the first driving circuit generates at least one first driving signal and sends the least one first driving signal to at least one second transmit electrode of the plurality of transmit electrodes, to compensate a baseline current between the plurality of receive electrodes and a ground terminal.

20 Claims, 5 Drawing Sheets

(52) U.S. Cl.
    CPC .  *H03K 17/962* (2013.01); *G06F 2203/04102* (2013.01); *H03K 2017/9613* (2013.01)

(56)                    References Cited

U.S. PATENT DOCUMENTS

2014/0152621  A1*   6/2014   Okayama .............. G06F 3/0416
                                                          345/174
2017/0061188  A1*   3/2017   Kremin ................ G06K 9/0002
2017/0358637  A1*  12/2017   Lee ......................... G06N 20/00
2018/0143711  A1*   5/2018   Ono ...................... G02F 1/1362

FOREIGN PATENT DOCUMENTS

CN          105373247  A       3/2016
CN          106154666  A      11/2016

OTHER PUBLICATIONS

English Abstract Translation of CN106154666A.
English Abstract Translation of CN105373247A.
English Abstract Translation of CN1941037A.
International Search Report of PCT/CN2017/076134.
English International Search Report of PCT/CN2017/076134.
Written Opinion of PCT/CN2017/076134.
European Search Report dated Apr. 15, 2019 by the European Patent Office for counterpart application No. 17899777.1.

* cited by examiner

CAPACITANCE DETECTION CIRCUIT AND ELECTRONIC DEVICE

CROSS-REFERENCE TO RELATED APPLICATIONS

The present disclosure is a continuation of international application No. PCT/CN2017/076134, filed on Mar. 9, 2017, which is hereby incorporated by reference in its entirety.

TECHNICAL FIELD

The present disclosure relates to a capacitance detection circuit and an electronic device, and in particular, to a capacitance detection circuit and an electronic device capable of reducing a baseline current between an electrode and a ground terminal.

BACKGROUND

With the development of technology, the operation interfaces for various electronic devices are getting more user-friendly in recent years. For example, by using a touch panel, the user may operate a screen or input a message/text/pattern on the screen with a finger or stylus, thereby saving the user the trouble of using an input device such as a keyboard or buttons. Generally, a touch screen is composed of a sensing panel and a display disposed behind the sensing panel. The electronic device recognizes a touch event according to the location of the user's touch on the sensing panel and the screen content displayed at the time of the touch, and executes an operation result correspondingly.

Mutual-capacitance sensing has been widely applied in electronic devices with the touch screen. With the advancement of technology and in response to the market demand, touch screens (such as flexible screens) with ultra-thin protective layers have been developed. However, for a touch screen having ultra-thin protective layers, coupling capacitance between a receive electrode (or a transmit electrode) and the finger is greater, making it more difficult to employ mutual-capacitance sensing. Further, a baseline current flowing through the receive electrode and a ground terminal exists no matter whether a touch event occurs or not, and such baseline current affects a detection result outputted from a capacitance detection circuit. Therefore, the dynamic range of an analog-to-digital converter (ADC) located at the back end of the capacitance detection circuit cannot be effectively utilized, but rather reduces the accuracy of the touch determination.

In view of the foregoing, there is a need for improvement in the related art.

SUMMARY

Therefore, a main object of some embodiments of the present disclosure is to provide a capacitance detection circuit and an electronic device capable of reducing a baseline current between an electrode and a ground terminal, so as to overcome the drawbacks of the prior art.

In order to resolve the above issues, the present disclosure provides a capacitance detection circuit. The capacitance detection circuit comprises a sense circuit, coupled to a plurality of receive electrodes and configured to generate a plurality of sense results, the plurality of sense results being associated with capacitance between a plurality of transmit electrodes and the plurality of receive electrodes; and a first driving circuit coupled to the plurality of transmit electrodes. When the first driving circuit keeps at least one first transmit electrode of the plurality of transmit electrodes floating, the first driving circuit generates at least one first driving signal, and sends the least one first driving signal to at least one second transmit electrode of the plurality of transmit electrodes, so as to compensate a baseline current between the plurality of receive electrodes and a ground terminal.

For instance, the first driving circuit comprises a plurality of driving units, and the plurality of driving units are coupled to the plurality of transmit electrodes, respectively.

For instance, each of the driving units comprises a driving switch.

For instance, the capacitance detection circuit further comprises a control unit. The control unit is coupled to the first driving circuit, and configured to control the first driving circuit.

For instance, the first driving circuit comprises a signal generator, configured to generate a first driving signal of the at least one first driving signal.

For instance, the driving switch comprises a common node, coupled to a transmit electrode of the plurality of transmit electrodes; a first node, coupled to the signal generator to receive the first driving signal; and a second node, wherein the second node is floating. The control unit controls a conduction state between the common node and each of the first node and the second node of the driving switch.

For instance, the driving switch comprises a third node, coupled to a ground terminal. The control unit controls a conduction state between the common node and each of the first node, the second node and the third node of the driving switch.

For instance, the signal generator is controlled by the control unit to generate a positive driving signal serving as the first driving signal or a negative driving signal serving as the first driving signal.

For instance, the positive driving signal and the negative driving signal have a phase difference of 180°.

For instance, the positive driving signal has a first frequency, the negative driving signal has a second frequency different from the first frequency, and the positive driving signal and the negative driving signal are orthogonal to each other.

For instance, the capacitance detection circuit further comprises a floating ground driving circuit, configured to generate a floating ground driving signal and send the floating ground driving signal to a signal ground terminal, wherein the floating ground driving signal is a positive floating ground signal or a negative floating ground signal.

For instance, the positive floating ground signal and the negative floating ground signal have a phase difference of 180°.

For instance, the positive floating ground signal has a third frequency, the negative floating ground signal has a fourth frequency different from the third frequency, and the positive floating ground signal and the negative floating ground signal are orthogonal to each other.

For instance, the control unit generates a first driving control signal and sends the first driving control signal to the signal generator according to the floating ground driving signal, and the signal generator generates the first driving signal according to the first driving control signal.

For instance, the control unit generates a floating ground control signal and sends the floating ground control signal to the floating ground driving circuit, and the floating ground driving circuit generates the floating ground driving signal according to the floating ground control signal.

For instance, the capacitance detection circuit further comprises a second driving circuit, coupled to the plurality of receive electrodes, the second driving circuit configured to generate a second driving signal and send the second driving signal to the plurality of receive electrodes.

For instance, the control unit generates a second driving control signal and sends the second driving control signal to the signal generator according to the second driving signal, and the signal generator generates the first driving signal according to the second driving control signal.

For instance, the control unit generates a control signal and sends the control signal to the second driving circuit, and the second driving circuit generates a positive signal serving as the second driving signal or a negative signal serving as the second driving signal according to the control signal.

For instance, the positive signal and the negative signal have a phase difference of 180°.

For instance, the positive signal has a fifth frequency, the negative signal has a sixth frequency different from the fifth frequency, and the positive signal and the negative signal are orthogonal to each other.

For instance, the first driving signal is an alternating current signal.

The present disclosure further provides an electronic device. The electronic device comprises a plurality of transmit electrodes; a plurality of receive electrodes; a capacitance detection circuit comprising a sense circuit coupled to the plurality of receive electrodes, and configured to generate a plurality of sense results, the plurality of sense results being associated with capacitance between the plurality of transmit electrodes and the plurality of receive electrodes; and a first driving circuit, coupled to the plurality of transmit electrodes, wherein when the first driving circuit keeps at least one first transmit electrode of the plurality of transmit electrodes floating, the first driving circuit generates at least one first driving signal, and sends the least one first driving signal to at least one second transmit electrode of the plurality of transmit electrodes; and a signal processing module, coupled to the capacitance detection circuit, the signal processing module configured to determine at least one touch location according to the plurality of sense results.

BRIEF DESCRIPTION OF THE DRAWINGS

On or more embodiments of the present disclosure are described below with referencing to corresponding drawings of the accompanying figures. These drawings should not be construed as limitations to the embodiments; elements designated with same or like reference numerals are like or similar elements; unless specified otherwise, elements or features are not drawn to scale.

DETAILED DESCRIPTION

The detailed description provided below in connection with the appended drawings is intended as a description of the present examples so that so that those skilled in the art may better understand the purposes, technical solutions, and advantages of the present application. It should be noted that the embodiments of the present application are provided for illustrative purposes, and are not limiting.

Figure 1:
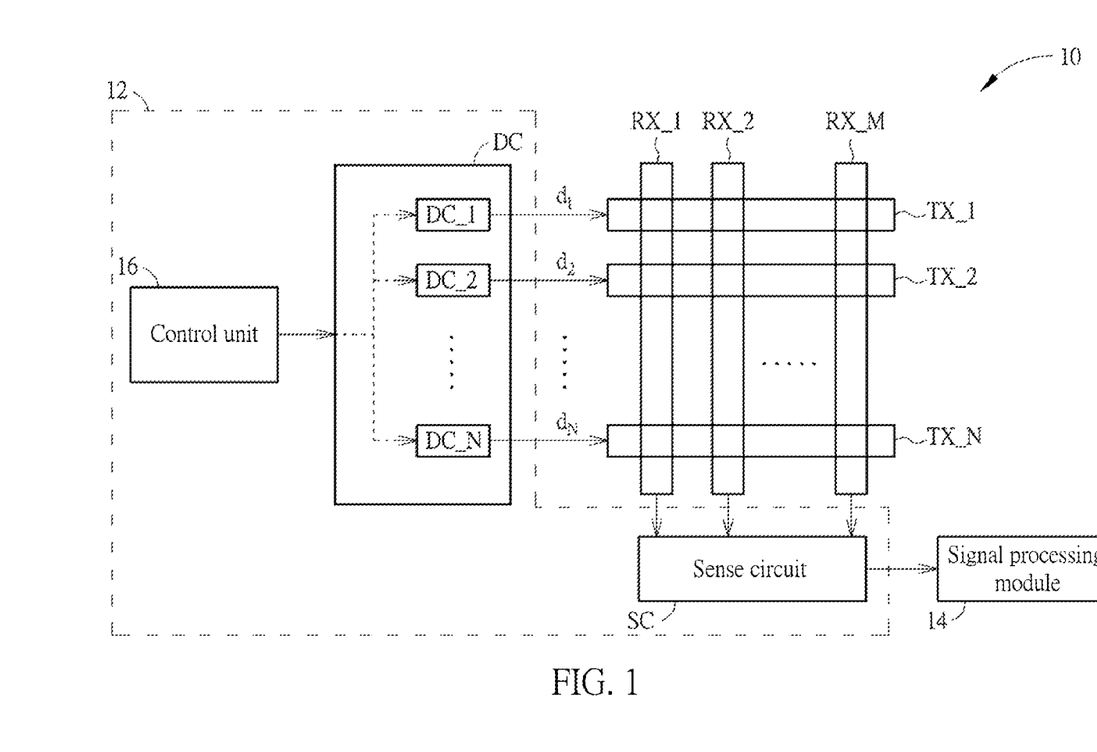
FIG. 1 is a schematic view of an electronic device according to embodiments of the present disclosure.

Referring to FIG. 1, a schematic view of an electronic device 10 is illustrated according to embodiments of the present disclosure. The electronic device 10 may be an electronic product having a touch screen, such as a laptop, a smartphone or a computer. The electronic device 10 comprises a plurality of transmit electrodes TX_1-TX_N, a plurality of receive electrodes RX_1-RX_M, a capacitance detection circuit 12, and a signal processing module 14. The transmit electrodes TX_1-TX_N and receive electrodes RX_1-RX_M are disposed in a touch screen or touch screen display (not shown in FIG. 1) of the electronic device 10, and are configured to display the content to be displayed and/or receive the touch control. The capacitance detection circuit 12 is coupled to the transmit electrodes TX_1-TX_N and the receive electrodes RX_1-RX_M, and is configured to sense a plurality of mutual capacitances between the transmit electrodes TX_1-TX_N and the receive electrodes RX_1-RX_M, so as to generate a plurality of sense results, wherein the sense results are associated with respective capacitance values of the mutual capacitances between the transmit electrode TX_1-TX_N and the receive electrodes RX_1-RX_M. The signal processing module 14 is coupled to the capacitance detection circuit 12, and is configured to calculate the mutual capacitances between the transmit electrodes TX_1-TX_N and the receive electrodes RX_1-RX_M according to a plurality of sense results, and to determine the location at which the touch event occurs according to the mutual capacitances.

Specifically, the capacitance detection circuit 12 comprises a driving circuit DC, a sense circuit SC, and a control unit 16, wherein the sense circuit SC is coupled to the receive electrodes RX_1-RX_M, and configured to generate a plurality of sense results corresponding to the receive electrodes RX_1-RX_M. The driving circuit DC is coupled to the transmit electrodes TX_1-TX_N, and configured to generate driving signals $d_1$-$d_N$ and send the driving signals $d_1$-$d_N$ to the transmit electrodes TX_1-TX_N. In one embodiment, the driving circuit DC may keep a transmit electrode TX_n of the transmit electrodes TX_1-TX_N in a floating state depending on an operating scenario; that is, the driving circuit DC may make the transmit electrode TX_n float as needed. However, when the transmit electrode TX_n is floating (or when the capacitance detection circuit 12 operates), a baseline current flows between the receive electrodes and the ground terminal, rather than between the transmit electrodes and receive electrodes. The baseline current represents the current flowing from the ground terminal to the receive electrodes, and among all the current flowing through the receive electrodes, only the currents flowing from the transmit electrodes to the receive electrodes are associated with the magnitude of the capacitance between the transmit electrodes and the receive electrodes. In this case, the voltage level/current level of the receive electrodes RX_1-RX_M would be affected by the baseline current; in other words, the plurality of sense results outputted by the capacitance detection circuit 12 comprise a level that is associated with the baseline current. For example, the plurality of sense results outputted by the capacitance detection circuit 12 comprises a voltage level that is associated with the baseline current). As a result, the dynamic range of the analog-to-digital converter (ADC) located at the back end of the capacitance detection circuit 12 cannot be effectively utilized, but rather reduces the accuracy of tough determination.

To avoid the effect caused by the baseline current on the plurality of sense results outputted by the capacitance detection circuit 12, in one embodiment, when the transmit electrode TX_n is floating (or when the capacitance detection circuit 12 operates), the driving circuit DC may generate driving signals $d_1$-$d_{n-1}$, $d_{n+1}$-$d_N$ to the transmit electrodes TX_1-TX_n−1, TX_n+1-TX_N, so as to reduce the effect caused by the baseline current on the plurality of sense results. Furthermore, in one embodiment, when the capacitance detection circuit 12 intends to detect the mutual capacitance between the transmit electrode TX_n and one receive electrode RX_m of the receive electrodes RX_1-RX_M, the driving circuit DC may make the transmit electrode TX_n floating.

Figure 2:
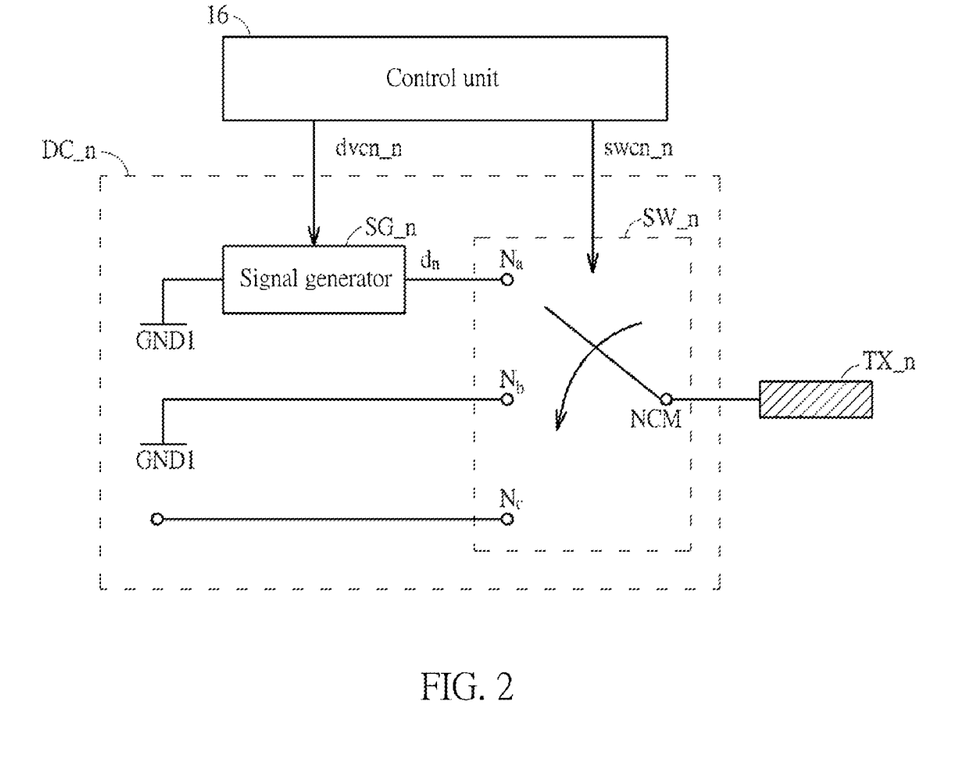
FIG. 2 is a schematic view of a driving unit according to embodiments of the present disclosure.

Further, the driving circuit DC comprises a plurality of driving units DC_1-DC_N, wherein the driving units DC_1-DC_N are coupled to transmit electrodes TX_1-TX_N respectively, and are configured to generate driving signals $d_1$-$d_N$ to the transmit electrodes TX_1-TX_N respectively. The driving unit DC_n of the driving units DC_1-DC_N is taken as an example in the following discussion. Reference is now made to FIG. 2, which is a schematic view of a driving unit DC_n according to embodiments of the present disclosure. As illustrated in FIG. 2, the driving unit DC_n comprises a driving switch SW_n. In this embodiment, the driving switch SW_n is a single-pole-triple-throw (SPTT) switch, which has a common node NCM and nodes $N_a$, $N_b$ and $N_c$. The common node NCM is coupled to the transmit electrode TX_n, the node $N_a$ is coupled to a signal generator SG_n, the node $N_b$ is coupled to a ground terminal GND1, and the node $N_c$ is floating. The driving switch SW_n is under the control of the control unit 16; that is, the control unit 16 may generate a switch control signal swcn_n to control a conduction state between the common node NCM and each of the nodes $N_a$, $N_b$ and $N_c$ of the driving switch SW_n. Furthermore, the signal generator SG_n is also under the control of the control unit 16; that is, the control unit 16 may generate a driving control signal dvcn_n to control the signal generator SG_n to generate a positive driving signal +T serving as the driving signal $d_n$, or a negative driving signal −T serving as the driving signal $d_n$, wherein the positive driving signal +T and the negative driving signal −T has a phase difference of 180° therebetween. When the common node NCM and the node $N_a$ are electrically connected under the control of the control unit 16, the driving units DC_n sends the positive driving signal +T or the negative driving signal −T to the transmit electrode TX_n; when the common node NCM and the node $N_b$ are electrically connected under the control of the control unit 16, the transmit electrode TX_n is electrically connected to the ground terminal GND1; when the common node NCM and node $N_c$ are electrically connected under the control of the control unit 16, the transmit electrode TX_n is floating. Furthermore, the circuit structure of the driving units DC_1-DC_C n−1, DC_n+1-DC_N may be the same as that of the driving units $DC_n$, and hence, a detailed description thereof is omitted herein.

Briefly, when the control unit 16 controls the transmit electrode TX_n to stay in a floating state, the control unit 16 may control the signal generator SG_n as needed, so that the driving units DC_1-DC_n−1, DC_n+1-DC_N generates driving signals $d_1$-$d_{n-1}$, $d_{n+1}$-$d_N$ to the transmit electrodes TX_1-TX_n−1, TX_n+1-TX_N, so as to reduce/eliminate the effect that the baseline current imposes on a plurality of sense results outputted by the capacitance detection circuit 12, thereby improving the accuracy in touch determination. Furthermore, the baseline current may vary due to the effect that other driving circuits, different from the driving circuit DC that is used to eliminate the baseline current, impose on the transmit electrodes or receive electrodes of the electronic device. As a result, the control unit 16 may control the driving signals $d_1$-$d_N$ according to the variation of the baseline current, so as to further reduce the effect that the current imposes on the plurality of sense results. Preferably, the control unit 16 may control the driving circuit DC to generate driving signals $d_1$-$d_N$, which can be used to compensate the baseline current as much as possible.

Figure 3:
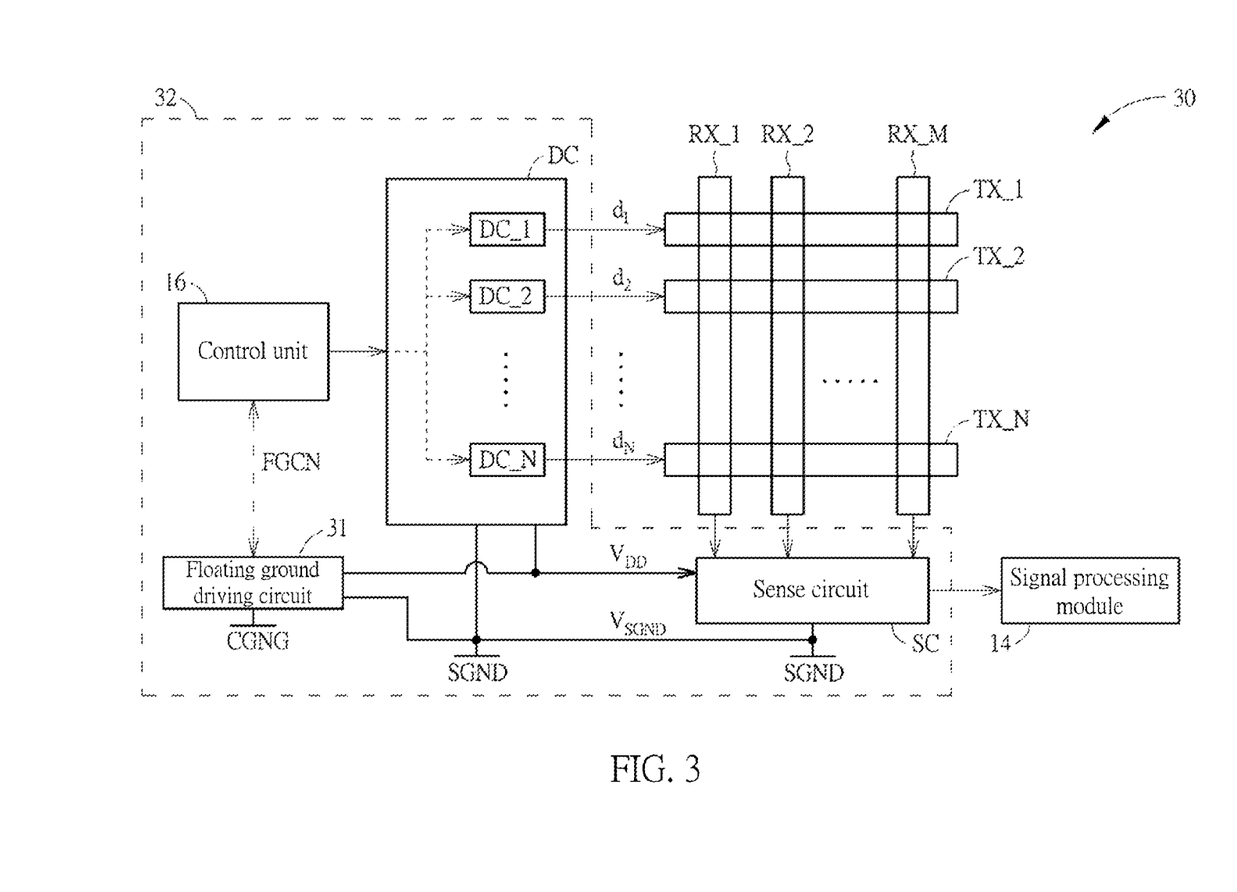
FIG. 3 is a schematic view of an electronic device according to embodiments of the present disclosure.

For example, reference is now made to FIG. 3, which is a schematic view of an electronic device 30 according to embodiments of the present disclosure. The electronic device 30 is similar to the electronic device 20, and hence, the same components/elements are designated with the same reference numerals. Unlike the electronic device 20, both the driving circuit DC and the sense circuit SC here have a signal ground terminal SGND. Additionally, a capacitance detection circuit 32 of the electronic device 30 further comprises a floating ground driving circuit 31, wherein the floating ground driving circuit 31 is coupled to a casing ground terminal CGND, the signal ground terminal SGND, and the sense circuit SC. The floating ground driving circuit 31 is configured to generate a floating ground driving signal $V_{SGND}$ relative to the casing ground terminal CGND, send the floating ground driving signal $V_{SGND}$ to the signal ground terminal SGND, and generate a power signal $V_{DD}$ to a power supply terminal of the sense circuit SC, wherein the power signal $V_{DD}$ and the floating ground driving signal $V_{SGND}$ are time-varying signals, and the power signal $V_{DD}$ and the floating ground driving signal $V_{SGND}$ may have a fixed voltage difference therebetween. Furthermore, in the electronic device 30, the driving units DC_1-DC_N are coupled to the signal ground terminal SGND. Specifically, the ground terminal GND1 of the driving units DC_1-DC_N in FIG. 2 is the signal ground terminal SGND in FIG. 3. In other words, the node $N_b$ of the driving switch SW_n in FIG. 2 is coupled to the signal ground terminal SGND in FIG. 3, and the signal generator SG_n in FIG. 2 is also coupled to the signal ground terminal SGND in FIG. 3. The operations of the floating ground driving circuit 31 have been described in the International patent application PCT/CN2016/111596 filed by the present applicant in connection with the floating ground driving circuit described therein, and hence, a detailed description thereof is omitted herein.

Please note that the floating ground driving signal $V_{SGND}$ is associated with the current level and current direction of the baseline current, and the driving signals $d_1$-$d_N$ are used to compensate the baseline current. Hence, the driving signals $d_1$-$d_N$ are associated with the floating ground driving signal $V_{SGND}$ generated by the floating ground driving circuit 31. In one embodiment, the control unit 16 may generate the driving control signals dvcn_1-dvcn_N corresponding to the driving units DC_1-DC_N according to the magnitude or the sign value of the floating ground driving signal $V_{SGND}$. As a result, the signal generators SG_1-SG_N of the driving units DC_1-DC_N may further generate the driving signals $d_1$-$d_N$ according to the driving control signals dvcn_1-dvcn_N. Furthermore, the signal generators SG_1-SG_N may generate the positive driving signal +T serving as the driving signals $d_1$-$d_N$, or the negative driving signal −T serving as the driving signals $d_1$-$d_N$, according to the driving control signals dvcn_1-dvcn_N. More precisely, when the transmit electrode TX_n is in a floating state (that is, the driving circuit DC makes the transmit electrode TX_n floating), the control unit 16 may generate driving control signals dvcn_1-dvcn_n−1 and dvcn_n+1-dvcn_N corresponding to the driving units DC_1-DC_n−1 and DC_n+1-DC_N according to the magnitude or sign value of the floating ground driving signal $V_{SGND}$. Accordingly, the driving units DC_1-DC_n−1 and DC_n+1-DC_N may generate and send the driving signals $d_1$-$d_{n−1}$ and $d_{n+1}$-$d_N$ to the transmit electrodes TX_1-TX_n−1 and TX_n+1-TX_N according to the driving control signals dvcn_1-dvcn_n−1 and dvcn_n+1-dvcn_N, so as to compensate the baseline current. For example, in one embodiment, when the floating ground driving signal $V_{SGND}$ is a positive floating ground signal +H, the control unit 16 may control the driving circuit DC to generate the negative driving signals −T (or the positive driving signals +T) serving as the driving signals $d_1$-$d_{n−1}$ and $d_{n+1}$-$d_N$, so as to eliminate the baseline current corresponding to the positive floating ground signal +H. In one embodiment, when the floating ground driving signal $V_{SGND}$ is a negative floating ground signal −H, the control unit 16 may control the driving circuit DC to generate driving signals the positive driving signals +T (or the negative driving signals −T) serving as the driving signals $d_1$-$d_{−1}$ and $d_{n+1}$-$d_N$, so as to eliminate the baseline current corresponding to the positive floating ground signal +H, wherein the positive floating ground signal +H and the negative floating ground signal −H have a phase difference of 180° therebetween.

In another embodiment, the control unit 16 may generate a floating ground control signal FGCN to the floating ground driving circuit 31, and then the floating ground driving circuit 31 may generate a floating ground driving signal $V_{SGND}$ according to the floating ground control signal FGCN. That is, the floating ground driving circuit 31 may generate the positive floating ground signal +H serving as the floating ground driving signal $V_{SGND}$, or the negative floating ground signal −H serving as the floating ground driving signal $V_{SGND}$, according to the floating ground control signal FGCN. Besides, the control unit 16 may also generate driving control signals dvcn_1-dvcn_N to the driving units DC_1-DC_N, and the driving units DC_1-DC_N may generate driving signals $d_1$-$d_N$ according to the driving control signals dvcn_1-dvcn_N, so as to compensate the baseline current. In one embodiment, the control unit 16 may control the floating ground driving circuit 31 to generate the positive floating ground signal +H serving as the floating ground driving signal $V_{SGND}$, and control the driving circuit DC to make the transmit electrode TX_n floating. In this way, the potential on the transmit electrode TX_n is the positive floating ground signal +H. Meanwhile, the control unit 16 may control the driving circuit DC to generate the negative driving signals −T (or the positive driving signals +T) serving as the driving signals $d_1$-$d_{n−1}$ and $d_{1+1}$-$d_N$, and send the driving signals $d_1$-$d_{n−1}$ and $d_{n+1}$-$d_N$ to the transmit electrodes TX_1-TX_n−1 and TX_n+1-TX_N, so as to eliminate the baseline current corresponding to the positive floating ground signal +H. In one embodiment, the control unit 16 may control the floating ground driving circuit 31 to generate the negative floating ground signal H serving as the floating ground driving signal $V_{SGND}$, and the control unit 16 may control the driving circuit DC to generate the positive driving signals +T (or the negative driving signals −T) serving as the driving signals $d_1$-$d_{n−1}$ and $d_{n+1}$-$d_N$, and send the driving signals $d_1$-$d_{n−1}$ and $d_{n+1}$-$d_N$ to the transmit electrodes TX_1-TX_n−1 and TX_n+1-TX_N, so as to eliminate the baseline current corresponding to the negative floating ground signal −H.

Figure 4:
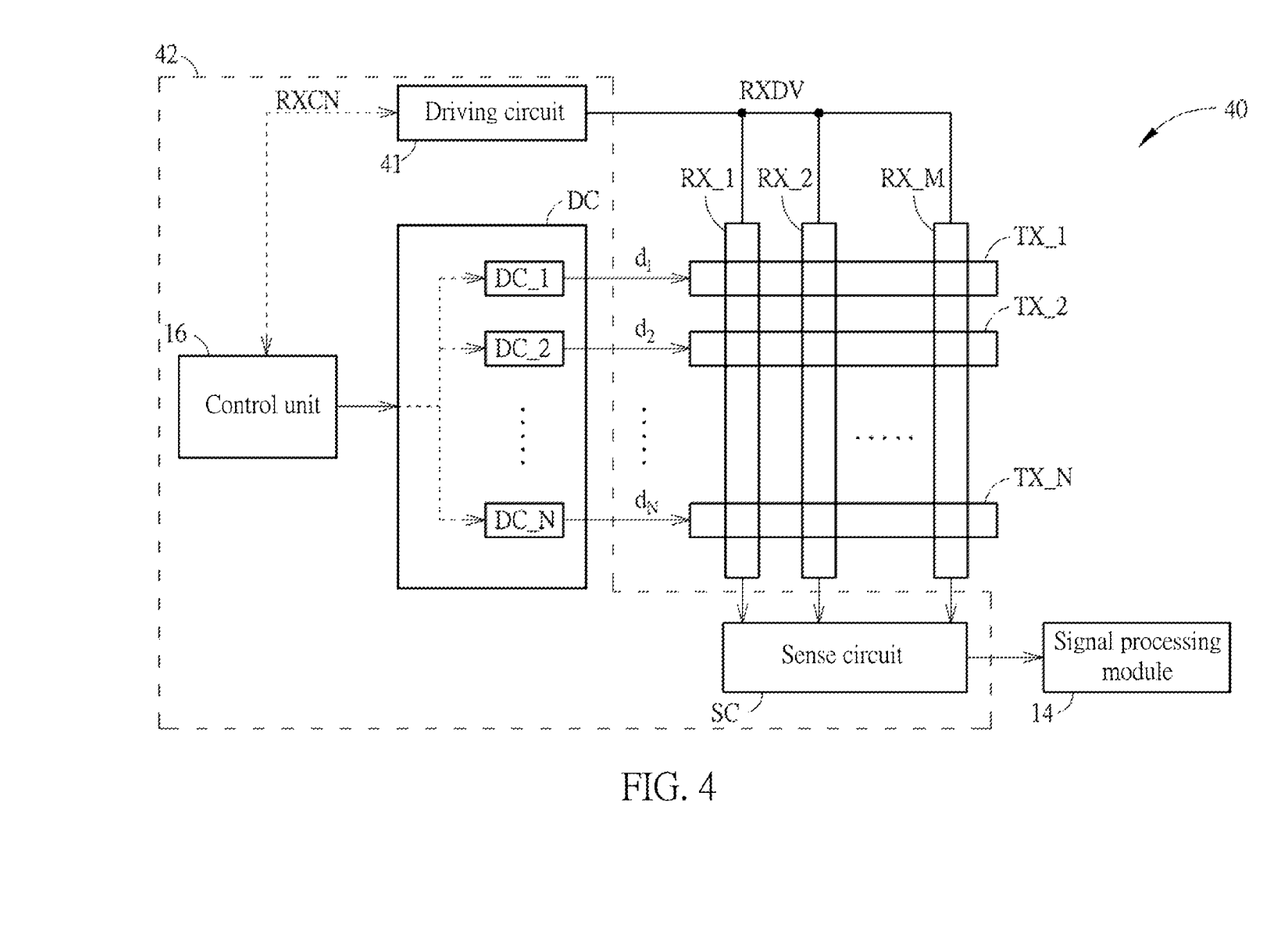
FIG. 4 is a schematic view of an electronic device according to embodiments of the present disclosure.

Furthermore, reference is directed to FIG. 4, which is a schematic view of an electronic device 40 according to embodiments of the present disclosure. The electronic device 40 is similar to the electronic device 20, and hence, the same components/elements are designated with the same reference numerals. Unlike the electronic device 20, the capacitance detection circuit 42 of the electronic device 40 further comprises a driving circuit 41, wherein the driving circuit 41 is coupled to the receive electrodes RX_1-RX_M, and is configured to generate a driving signal RXDV and send the driving signal RXDV to the receive electrodes RX_1-RX_M. The operations of the driving circuit 41 and the sense circuit SC have been described in the International patent application PCT/CN2016/111595 filed by the present applicant in connection with the driving circuit and the sense circuit described therein, and hence, a detailed description thereof is omitted herein.

Please note that the driving signal RXDV is associated with the current level and current direction of the baseline current, and the driving signals $d_1$-$d_N$ are used to compensate the baseline current. Hence, the driving signals $d_1$-$d_N$ are associated with the driving signal RXDV generated by the driving circuit 41. In one embodiment, the control unit 16 may generate the driving control signals dvcn_1-dvcn_N corresponding to the driving units DC_1-DC_N according to the magnitude or the sign value of the driving signal RXDV, and hence, the signal generators SG_1-SG_N of the driving units DC_1-DC_N may further generate the driving signals $d_1$-$d_N$ according to the driving control signals dvcn_1-dvcn_N. Furthermore, the signal generators SG_1-SG_N may generate the positive driving signal +T serving as the driving signals $d_1$-$d_N$, or the negative driving signal −T serving as the driving signals $d_1$-$d_N$, according to the driving control signals dvcn_1-dvcn_N. More precisely, when the transmit electrode TX_n is in a floating state (that is, the driving circuit DC makes the transmit electrode TX_n floating), the control unit 16 may generate driving control signals dvcn_1-dvcn_n−1 and dvcn_n+1-dvcn_N corresponding to the driving units DC_1-DC_n−1 and DC_n+1-DC_N according to the magnitude or sign value of the floating ground driving signal $V_{SGND}$. Accordingly, the driving units DC_1-DC_n−1 and DC_n+1-DC_N may generate and send the driving signals $d_1$-$d_{n−1}$ and $d_{n+1}$-$d_N$ to the transmit electrodes TX_1-TX_n−1 and TX_n+1-TX_N according to the driving control signals dvcn_1-dvcn_n−1 and dvcn_n+1-dvcn_N, so as to compensate the baseline current.

In another embodiment, the control unit 16 may generate a control signal RXCN to the driving circuit 41, and then the driving circuit 41 may generate the driving signal RXDV according to the control signal RXCN. For example, the driving circuit 41 may generate a positive signal +HZ serving as the driving signal RXDV, or a negative signal −HZ serving as the driving signal RXDV, according to the control signal RXCN, wherein the positive signal +HZ and the negative signal −HZ may have a phase difference of 180°. Besides, the control unit 16 may also generate and send driving control signals dvcn_1-dvcn_N to the driving units DC_1-DC_N, and the driving units DC_1-DC_N may generate driving signals $d_1$-$d_N$ according to the driving control signals dvcn_1-dvcn_N, so as to compensate the baseline current. In one embodiment, the control unit 16 may control the driving circuit 41 to generate the positive signal +HZ serving as the driving signal RXDV, and control the driving circuit DC to make the transmit electrode TX_n floating. Meanwhile, the control unit 16 may control the driving circuit DC to generate and send the driving signals $d_1$-$d_{l-1}$ and $d_{n+1}$-$d_N$ to the transmit electrodes TX_1-TX_n−1 and TX_n+1-TX_N, so as to eliminate the baseline current corresponding to the positive signal +HZ, wherein the driving signals $d_1$-$d_{n-1}$, $d_{n+1}$-$d_N$ can be the negative driving signals −T (or the positive driving signals +T). In one embodiment, the control unit 16 may control the driving circuit 41 to generate the negative signal −HZ serving as the driving signal RXDV, and the control unit 16 may control the driving circuit DC to generate and send the driving signals $d_1$-$d_{n-1}$ and $d_{n+1}$-$d_N$ to the transmit electrodes TX_1-TX_n−1 and TX_n+1-TX_N, so as to eliminate the baseline current corresponding to the negative signal −HZ, wherein the driving signals $d_1$-$d_{n-1}$ and $d_{n+1}$-$d_N$ may be the positive driving signals +T (or the negative driving signals −T).

Figure 5:
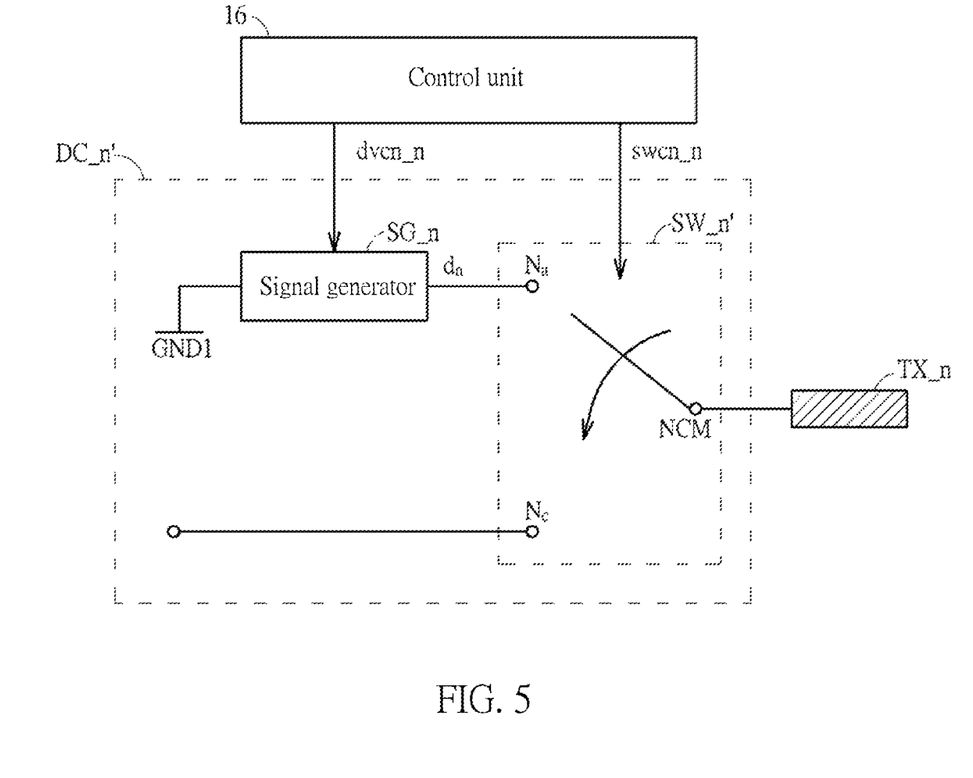
FIG. 5 is a schematic view of a driving unit according to embodiments of the present disclosure.

It should be noted that, the purpose of the foregoing embodiments is to describe the concept of the present disclosure, persons having ordinary skill in the art may make various modification thereto, and the present disclosure is not limited to these embodiments. For example, the driving switch SW_n of the driving unit DC_n is not limited to the single-pole-triple-throw switch; rather, the driving switch may be a single-pole-double-throw (SPDT) switch. Reference is now directed to FIG. 5, which is a schematic view of a driving unit DC_n' according to embodiments of the present disclosure. As illustrated in FIG. 5, the driving unit DC_n' comprises a driving switch SW_n', wherein the driving switch SW_n' is a single-pole-double-throw switch, which has the common node NCM and nodes $N_a$ and $N_c$. When the circuit structure of the driving units DC_1' to DC_n−1' and DC_n+1' to DC_N' is the same as that of the driving units DC_n', it means that the transmit electrodes TX_1-TX_N can be floating or configured to receive the driving signals $d_1$-$d_N$. This configuration also falls within the scope of the present disclosure. Furthermore, the signal generator configured to generate driving signals $d_1$-$d_N$ is not limited to those arranged in the driving units DC_1-DC_N. For example, the driving circuit DC may comprise a signal generator SG disposed external to the driving units DC_1-DC_N, wherein the signal generator SG is configured to generate driving signals $d_1$-$d_N$, and the node $N_a$ of the driving switches SW_1-SW_N disposed within the driving units DC_1-DC_N can be coupled to the signal generator SG to receive the driving signals $d_1$-$d_N$. This configuration also falls within the scope of the present disclosure.

Furthermore, embodiments of the present disclosure are not limited to the electronic device making a single transmit electrode floating at a time point. In one embodiment, the present electronic device may make a plurality of transmit electrodes of the transmit electrodes TX_1-TX_N floating, and control the driving circuit DC to generate and send the driving signal to the non-floating transmit electrodes. For example, at a first time point, the electronic device may make the transmit electrode TX_n and transmit electrode TX_k of the transmit electrodes TX_1-TX_N floating, and control the driving circuit DC to generate and send $d_1$-$d_{n-1}$, $d_{n+1}$-$d_{k-1}$ and $d_{k+1}$-$d_N$ to the transmit electrodes TX_1-TX_n−1, TX_n+1-TX_k−1 and TX_k+1-TX_N. Furthermore, when the electronic device makes at least one transmit electrode of the transmit electrodes TX_1-TX_N floating, the driving circuit DC is not limited to generate the driving signal to all the non-floating transmit electrodes. Rather, the driving circuit DC may generate the driving signal to a portion of the non-floating transmit electrodes. Furthermore, the driving circuit DC may only generate a single driving signal $d_j$ to a single non-floating transmit electrode TX_j of the transmit electrodes TX_1-TX_N. As long as the driving signal $d_j$ can drive the transmit electrode TX_j and generate the current sufficient to compensate the baseline current, such configuration also falls within the scope of the present disclosure.

Furthermore, the phase difference between the positive driving signal +T and the negative driving signal −T generated by the signal generator SG_n is not limited to 180°. Instead, the positive driving signal +T and the negative driving signal −T may be two frequency-shift keying (FSK) signals. For example, the positive driving signal +T may have a frequency $f_{+T}$, and the negative driving signal −T may have a frequency $f_{-T}$, wherein the frequency $f_{+T}$ is different from the frequency $f_{-T}$, so that the positive driving signal +T and negative driving signal −T are orthogonal to each other during a cycle period.

Furthermore, the phase difference between the positive signal +H and the negative signal −H generated by the floating ground driving circuit 31 is not limited to 180°. Instead, the positive driving signal +H and the negative driving signal −H may also be two FSK signals. For example, the positive signal +H may have a frequency $f_{+H}$, and the negative signal −H may have a frequency $f_{-H}$, wherein the frequency $f_{+H}$ is different from the frequency $f_{-H}$, so that the positive signal +H and negative signal −H are orthogonal to each other during a cycle period. Furthermore, the control unit 16 may generate the driving control signals dvcn_1-dvcn_N corresponding to the driving units DC_1-DC_N according to the frequency of the floating ground driving signal $V_{SGND}$.

Furthermore, the phase difference between the positive signal +HZ and the negative signal −HZ generated by the driving circuit 41 is not limited to 180°; instead, the positive signal +HZ and the negative signal −HZ may also be two FSK signals. For example, the positive signal +HZ may have a frequency $f_{+HZ}$, and the negative signal −HZ may have a frequency $f_{-HZ}$, wherein the frequency $f_{+HZ}$ is different from the frequency $f_{-HZ}$, so that the positive signal +HX and negative signal −HZ are orthogonal to each other during a cycle period. Furthermore, the control unit 16 may generate the driving control signals dvcn_1-dvcn_N corresponding to the driving units DC_1-DC_N according to the frequency of the driving signal RXDV.

Furthermore, the driving signals $d_1$-$d_N$ may be in direct proportion to an alternating current (AC) signal, which is a sinusoidal wave, a square wave or a triangular wave. When the driving signals $d_1$-$d_N$ is in direct proportion to the sinusoidal wave, the signal processing module 14 may use an orthogonal demodulation technique to calculate the mutual capacitance between the transmit electrodes and receive electrodes according to a plurality of sense results. The process for using the orthogonal demodulation technique to calculate the mutual capacitance between the transmit electrodes and receive electrodes according to a plurality of sense results is well known to persons having ordinary skill in the art, and hence a detailed description regarding the same is omitted.

In view of the foregoing, the present disclosure employs a driving circuit to generate the driving signal to the transmit electrodes, so as to eliminate the baseline current between the ground terminal and the receive electrodes. In this way, the present disclosure may effectively utilize the dynamic range of the ADC located at the back end of to the capacitance detection circuit, thereby increasing the accuracy in touch determination.

The detailed description sets forth only some of the embodiments of the present disclosure, and should not be construed to limit the scope of the present invention. Any modification, equivalent substitution and improvement within the spirits and principles of the present invention fall within the protection scope of the present disclosure.

What is claimed is:

1. A capacitance detection circuit for use in an electronic device, the electronic device comprising a plurality of transmit electrodes and a plurality of receive electrodes, the capacitance detection circuit comprising:
   a sense circuit, coupled to the plurality of receive electrodes, the sense circuit configured to generate a plurality of sense results, wherein the plurality of sense results are associated with capacitance between the plurality of transmit electrodes and the plurality of receive electrodes; and
   a first driving circuit, coupled to the plurality of transmit electrodes;
   wherein when the first driving circuit keeps at least one first transmit electrode of the plurality of transmit electrodes floating, the first driving circuit generates at least one first driving signal, and sends the least one first driving signal to at least one second transmit electrode of the plurality of transmit electrodes.

2. The capacitance detection circuit of claim 1, wherein the first driving circuit comprises a plurality of driving units, the plurality of driving units are coupled to the plurality of transmit electrodes, respectively, and each of the driving units comprises a driving switch.

3. The capacitance detection circuit of claim 2, further comprising:
   a control unit, coupled to the first driving circuit, the control unit configured to control the first driving circuit.

4. The capacitance detection circuit of claim 3, wherein the first driving circuit comprises:
   a signal generator, configured to generate the at least one first driving signal.

5. The capacitance detection circuit of claim 4, wherein the driving switch comprises:
   a common node, coupled to a transmit electrode of the plurality of transmit electrodes;
   a first node, coupled to the signal generator to receive the first driving signal; and
   a second node, wherein the second node is floating;
   wherein the control unit controls a conduction state between the common node and each of the first node and the second node of the driving switch.

6. The capacitance detection circuit of claim 5, wherein the driving switch comprises:
   a third node, coupled to a ground terminal;
   wherein the control unit controls a conduction state between the common node and each of the first node, the second node and the third node of the driving switch.

7. The capacitance detection circuit of claim 4, wherein the signal generator is controlled by the control unit to generate a positive driving signal serving as the first driving signal or a negative driving signal serving as the first driving signal.

8. The capacitance detection circuit of claim 7, wherein the positive driving signal and the negative driving signal have a phase difference of 180°.

9. The capacitance detection circuit of claim 7, wherein the positive driving signal has a first frequency, the negative driving signal has a second frequency different from the first frequency, and the positive driving signal and the negative driving signal are orthogonal to each other.

10. The capacitance detection circuit of claim 4, further comprising:
   a floating ground driving circuit, configured to generate a floating ground driving signal and send the floating ground driving signal to a signal ground terminal, wherein the floating ground driving signal is a positive floating ground signal or a negative floating ground signal.

11. The capacitance detection circuit of claim 10, wherein the positive floating ground signal and the negative floating ground signal have a phase difference of 180°.

12. The capacitance detection circuit of claim 10, wherein the positive floating ground signal has a third frequency, the negative floating ground signal has a fourth frequency different from the third frequency, and the positive floating ground signal and the negative floating ground signal are orthogonal to each other.

13. The capacitance detection circuit of claim 10, wherein the control unit generates a first driving control signal and sends the first driving control signal to the signal generator according to the floating ground driving signal, and the signal generator generates the first driving signal according to the first driving control signal.

14. The capacitance detection circuit of claim 10, wherein the control unit generates a floating ground control signal and sends the floating ground control signal to the floating ground driving circuit, and the floating ground driving circuit generates the floating ground driving signal according to the floating ground control signal.

15. The capacitance detection circuit of claim 4, further comprising:
   a second driving circuit, coupled to the plurality of receive electrodes, the second driving circuit configured to generate a second driving signal and send the second driving signal to the plurality of receive electrodes.

16. The capacitance detection circuit of claim 15, wherein the control unit generates a second driving control signal and sends the second driving control signal to the signal generator according to the second driving signal, and the signal generator generates the first driving signal according to the second driving control signal.

17. The capacitance detection circuit of claim 15, wherein the control unit generates a control signal and sends the control signal to the second driving circuit, and the second driving circuit generates a positive signal serving as the second driving signal or a negative signal serving as the second driving signal according to the control signal.

18. The capacitance detection circuit of claim 17, wherein the positive signal and the negative signal have a phase difference of 180°.

19. The capacitance detection circuit of claim 17, wherein the positive signal has a fifth frequency, the negative signal has a sixth frequency different from the fifth frequency, and the positive signal and the negative signal are orthogonal to each other.

20. An electronic device, comprising:
   a plurality of transmit electrodes;
   a plurality of receive electrodes;
   a capacitance detection circuit for use in an electronic device, the electronic device comprising a plurality of transmit electrodes and a plurality of receive electrodes, the capacitance detection circuit comprising:
      a sense circuit, coupled to the plurality of receive electrodes, the sense circuit configured to generate a plurality of sense results, wherein the plurality of sense results are associated with capacitance between the plurality of transmit electrodes and the plurality of receive electrodes; and a first driving circuit, coupled to the plurality of transmit electrodes;
wherein when the first driving circuit keeps at least one first transmit electrode of the plurality of transmit electrodes floating, the first driving circuit generates at least one first driving signal, and sends the least one first driving signal to at least one second transmit electrode of the plurality of transmit electrodes; and
a signal processing module, coupled to the capacitance detection circuit, the signal processing module configured to determine at least one touch location according to the plurality of sense results.

* * * * *